US009355942B2

(12) United States Patent
Samson et al.

(10) Patent No.: US 9,355,942 B2
(45) Date of Patent: May 31, 2016

(54) GANG CLIPS HAVING DISTRIBUTED-FUNCTION TIE BARS

(71) Applicant: Texas Instruments Incorporated, Dallas, TX (US)

(72) Inventors: Roxanna Bauzon Samson, Benguet (PH); Jeffrey de Guzman Esquejo, Taguig (PH); Ramices Julian Sanchez, Tarlac (PH); Ramil Alfonso Viluan, Pangasinan (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/278,094

(22) Filed: May 15, 2014

(65) Prior Publication Data
US 2015/0332989 A1 Nov. 19, 2015

(51) Int. Cl.
*H01L 23/495* (2006.01)
*H01L 23/00* (2006.01)
(52) U.S. Cl.
CPC .... *H01L 23/49517* (2013.01); *H01L 23/49524* (2013.01); *H01L 23/49541* (2013.01); *H01L 23/49548* (2013.01); *H01L 23/49575* (2013.01); *H01L 24/97* (2013.01); *H01L 23/49562* (2013.01); *H01L 2224/48091* (2013.01); *H01L 2224/48137* (2013.01); *H01L 2224/48247* (2013.01); *H01L 2224/49111* (2013.01)
(58) Field of Classification Search
CPC ..... H01L 21/56; H01L 21/563; H01L 21/565; H01L 21/28078; H01L 21/4825; H01L 21/6836; H01L 21/68721; H01L 21/7607; H01L 21/76894; H01L 27/1104; H01L 29/435; H01L 29/0852; H01L 23/4095; H01L 23/9565; H01L 23/49582; H01L 23/49586; H01L 23/53242; H01L 23/488; H01L 23/3114; H01L 23/4951; H01L 23/53219; H01L 23/53233
USPC ......... 257/670, 672, 350, 401, 443, 503, 620, 257/614, 615, 618, 631, 673, 691, 692, 734, 257/735, 745, 782, 765, 766, 787, E21.006, 257/E21.126, E21.127, E21.214, E21.238, 257/E21.4, E21.421, E21, 483, E21.499, 257/E21.502
See application file for complete search history.

(56) References Cited

U.S. PATENT DOCUMENTS 6,781,219 B2 * 8/2004 Bissey ........................... 257/666
6,815,746 B2 * 11/2004 Suzuki et al. ................. 257/296
7,485,954 B2 * 2/2009 Havanur ....................... 257/686
7,663,211 B2 2/2010 Noquil et al.
(Continued)

OTHER PUBLICATIONS

Notification of Transmittal of the International Search Report and the Written Opinion of the International Searching Authority, or Declaration mail date Oct. 22, 2015.

*Primary Examiner* — David Nhu
(74) *Attorney, Agent, or Firm* — Steven A. Shaw; Frank D. Cimino

(57) ABSTRACT

Gang clips (500) having a flat area (510), a ridge (510*a*), and tie bars (530*b*) extending from the flat area, the end portions of the ties bars aligned in a common x-direction; a plurality of gang clips having respective end portions of tie bars merged in x-direction to form an elongated chain (701) of clips; and a plurality of chains arrayed parallel to each other, free of tie bars between adjacent chains, the plurality having the chain ends tied at both ends (730*a*) to rails (740) normal to the chains to form a matrix (700) of clips having the rails as a stable frame.

8 Claims, 7 Drawing Sheets

(56) References Cited

U.S. PATENT DOCUMENTS

| | | |
|---|---|---|
| 7,936,054 B2 * | 5/2011 | Eom et al. .................... 257/675 |
| 8,299,588 B1 * | 10/2012 | Tateishi et al. ............... 257/676 |
| 2005/0127483 A1 | 6/2005 | Joshi et al. |
| 2011/0033724 A1 | 2/2011 | Carpenter, Jr. et al. |
| 2012/0200281 A1 | 8/2012 | Herbsommer et al. |
| 2012/0248521 A1 | 10/2012 | Herbsommer et al. |
| 2014/0063744 A1 | 3/2014 | Lopez et al. |
| 2014/0306332 A1 * | 10/2014 | Denison et al. ............... 257/676 |

* cited by examiner

US 9,355,942 B2

GANG CLIPS HAVING DISTRIBUTED-FUNCTION TIE BARS

FIELD

The present invention is related in general to the field of semiconductor devices and processes, and more specifically to the structure of gang clips used in semiconductor device fabrication, assembly, and test processes.

DESCRIPTION OF RELATED ART

The performance of semiconductor devices such as power supply systems and DC/DC converters depends to some extent on the magnitude of parasitic resistances and inductances. In order to reduce the value of these parasitic parameters, many semiconductor devices have replaced their traditional connections using thin bonding wires by connections using thick metal clips, since it is well known that due to their lengths and resistances, thin and long bonding wires introduce significant parasitic impedances and inductances into the power circuit, while metal clips contribute only low parasitic impedances and inductances. As an example, in recently introduced semiconductor power supply systems, clips substitute for many connecting wires. For their function, clips are made as wide and thick metallic pieces typically shaped as a flat connector with an angled ridge; due to their low electrical resistance and high thermal conductance, clips have significantly reduced parasitic inductance, but offer enhanced heat dissipation.

In order to simplify the assembly processes of semiconductor power supply systems and keep fabrication cost low, it is advantageous to perform the application of clips as a batch process in wafer-level fabrication flow. Referring to the batch process, a clip suitable for this process is often called a gang clip. For the batch process of available production, clips are provided in array form held together by an outer frame. Inside that frame, each clip of the array is positioned within a discrete rectangle of tie rails, held in precise position by tie bars to the rails. Each clip shares its tie rails with the nearest adjacent clips. The network of arrayed clips within the outer frame is manufactured from a single sheet of metal. Since the clips are fastened by tie bars within their respective tie rail rectangle, the clips can be assembled with precision to semiconductor chips the assembly flow of the system-under-construction. The rails will be removed by sawing after the encapsulation process.

As an example, the fabrication of a conventional power supply system such as a DC/DC converter may progress in generalized and approximate fashion in the following assembly steps. As the start, a plurality of leadframes is stamped or etched from a sheet of metal. The leadframe units are arrayed in regular rows and columns; each leadframe unit has a pad and a plurality of pins held in place by tie rails laid out in rectangles. Adjacent units share tie rails; the rails will be removed by sawing after the encapsulation process. Each pad serves as the basis of a power supply system to be stacked vertically, including two semiconductor FET (MOS field effect transistor) chips and two connecting clips.

Metallic clips are generally shaped to include a flat area for contacting an FET terminal and, at an angle to the flat area, a ridge for reaching a contact pad or leadframe lead. In the example of a power supply system as shown in FIG. 1, the vertical stacking of two FETs 101 and 102 requires clips of two distinct shapes; the bottom (first) clip is designated 110, the top (second) clip is designated 120. As stated, the clips of each shape are stamped as gang clips from a sheet of metal so that the clips 110 and 120 are arrayed in regular rows and columns. Each clip is held in place by tie bars 111 and 121, respectively, which are fastened to a discrete rectangle of tie rails 112 and 122, respectively. These tie rails have the function of holding the clips in a precise, locally fixed position. The tie rails 112 of the first clip 110, and the tie rails 122 of the second clip 120 have the same geometrical dimensions as the tie rails 132 of the leadframe 130.

An example of a clip array is shown in FIG. 2 for the top clip 120. Each clip 120 is surrounded by a rectangular stability frame made of tie rails 122a in x-direction and tie rails 122b in y-direction normal to 122a. Clips 120 are held in place and stabilized relative to the stability frame by tie bars 121a (x-direction of tie rail 122a) and tie bars 121b (y-direction of tie rail 122b). An analogous geometrical layout holds for bottom clip 110 so that tie rails 112a and 112b of the bottom clip 110 and tie rails 122a and 122b of the top clip 120 have matching geometrical dimensions. In addition, both tie rails match the tie rails 132 of leadframe 130.

Referring now to FIG. 1 and the steps for assembling a power supply system on each substrate: A first FET chip 101 is attached to the pad 131 of a leadframe of the array sheet. In addition, an integrated circuit driver-and-control chip 103 may be attached to each pad adjacent to the first FET chip 101. Then, a sheet with the first gang clips is aligned in order to attach the flat area of first clip 110 vertically to the first FET chip, and the ridge 110a of first clip 110 to a respective substrate pin. The tie rails 112a and 112b of the first clip are exactly aligned with the tie rails of the substrate.

Next, a second FET chip 102 is vertically attached to first clip 110. A sheet with the second gang clips is aligned in order to attach the flat area of second clip 120 vertically to the second FET chip, and the ridge 120a of second clip 120 to a respective substrate pin. The tie rails 122a and 122b of the second clip are exactly aligned with the tie rails of the bottom clip and the tie rails of the substrate. FIG. 1 illustrates the alignment of the tie rails 112a, 112b of the first (bottom) clip, the tie rails 122a, 122b of the second (top) clip, and the tie rails 132 of the leadframe. FIG. 3 shows an X-ray side view of the completed assembly, revealing the stacked and aligned metallic tie rails 112a, 122a, and 132. All three of these tie rails have to be cut during the singulation process.

In the next process step, the array of vertical stacks of FET chips and clips is encapsulated in a packaging material 160 such as a molding compound. Due to the market pressure demanding miniaturized product outlines with regard to size and thickness, the thickness 161 of encapsulation material above the top of the second clip and its tie bars and tie rails has to be kept thin For singulating the assembled array into discrete packaged systems, rotating saws 140 and 141 are applied to cut through the plastic package compound and along the levels of the three aligned tie rails of the substrate, the first clip, and the second clip. The singulation step is indicated in the example of FIG. 1 by the saws and their cutting directions; the directions of the cuts are indicated by arrows 150 and 151. The sawing step creates the package sidewalls of the system.

A view of a sidewall of the packaged system, which is created by the sawing process of saw 140, is displayed in FIG. 4. The view reveals a cross section through the packaging material 160 and three levels of cut tie bars, which the saw had to sever during the singulation operation. The top cuts belong to the tie bars 121b, which connected clip 120 to the now removed tie rail 122a; the cuts in the middle belong to tie bars 111b, which connected clip 110 to the now removed tie rail 112a; and the bottom cuts belong to some leads and tie bars 131b of leadframe 130, which connected leads and pad 131 to the now removed leadframe rails 132.

SUMMARY

It has been observed that the sawing operation of power supply systems vertically assembled on metallic leadframes caused significant yield loss of packaged systems. Applicants' failure analysis of the yield loss revealed as a major contributor the chipping of package compound and exposure of underlying metal. The origin of the chipped-out package compound was found to be predominantly from the thin layer of molding material resting on top of the system's top clip. Some examples of the location of chipped out package material 162 are indicated in FIG. 4.

Applicants found that the root cause of the package chipping was a statistically disturbed alignment between the tie rails 112a, 112b of the first clip, the tie rails 122a, 122b of the second clip, and the rails 132 of the leadframe. The disturbance, in turn, resulted from metal sweeps during the transfer molding process; the progression of the molding compound entering the mold cavity affects the alignment of tie bars. As a consequence of the disturbed alignment, the rotating saw of the singulation step has to cut through slightly misaligned tie rails, chipping out package compound.

Applicants solved the alignment and chipping problem when they discovered a methodology to avoid any alignment shift by eliminating the tie rails altogether and distributing the functions of conventional tie rails among now differently coupled tie bars and a temporary master frame, which is being removed during the singulation step.

In the new arrangement, the clips still have a flat area and an angled ridge, and an array is stamped from a single sheet of metal. As gang clips, the clips are aligned in rows, which run parallel to each other. Along a row, the clips are coupled to one another by tie bars substantially oriented in the line of the row. Adjacent rows, however, are not connected by tie bars, thereby eliminating any tie rails. Rather, the stability of a row is assured by coupling each row end to a master frame, which runs normal to the rows and will not be incorporated in encapsulation material; it can thus easily be trimmed in the singulation process. As a consequence, the rotating saw of the singulation step has no tie rails to cut, simplifying the singulation process; the saws are cutting only through package material until they are cutting through the leadframe tie bars. It is a significant technical advantage that there are no more chipped-out pieces of package material.

It is a further technical advantage that the new design of the clip metal sheets reduces the wear and tear of the saw blades, since the saws have much less metal to cut. In addition, the time for the singulation step can be reduced, since the speed of the sawing operation can be increased.

BRIEF DESCRIPTION OF THE DRAWINGS

FIG. 2 (Prior Art) illustrates a top view of a strip of

DETAILED DESCRIPTION OF THE PREFERRED EMBODIMENTS

Figure 5:
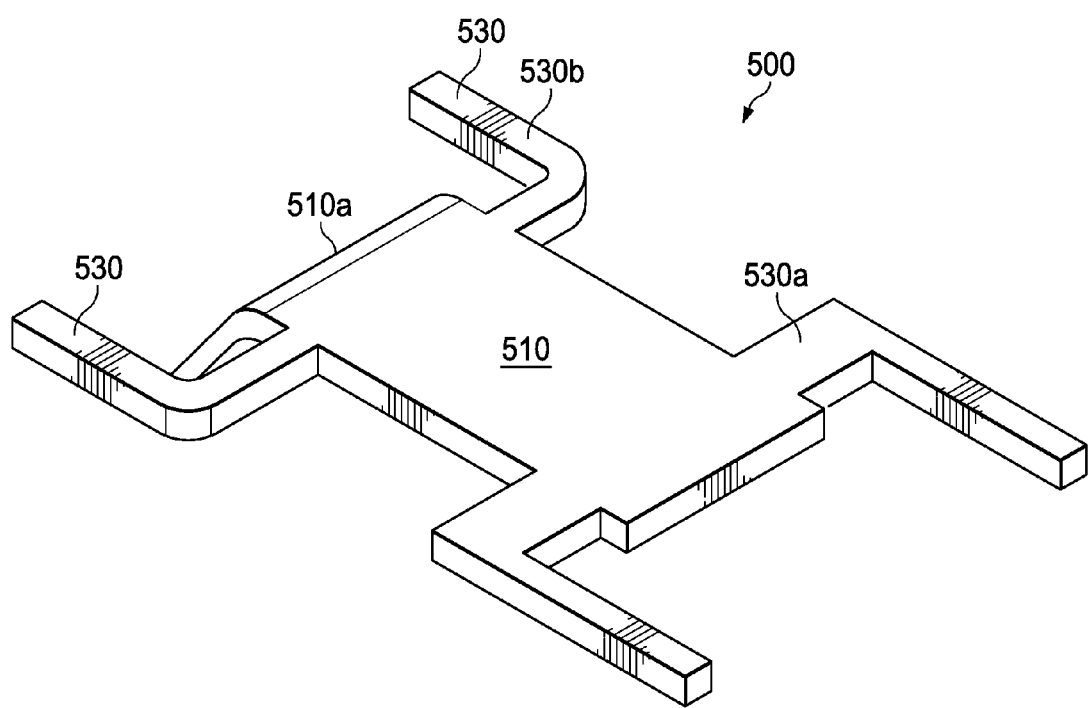
FIG. 5 illustrates a perspective view a clip designed as a gang clip in x-direction rows without y-direction tie bars.

FIG. 5 illustrates an exemplary metallic clip generally designated 500, which is designed as a gang clip without the need for a stabilizing frame of tie rails. For the purposes of this description, the terms clip and gang clip will be understood to refer to preformed conductive interconnects of a power transistor module, which are attached to a power transistor after the power transistor is singulated from a semiconductor wafer containing other units of power transistors. A clip may be provided as a piece part, while a gang chip is generally provided as a unit of a network held together by connecting bars, which will be trimmed at time of singulation. As further practiced herein, the term tie rail is applied to a metallic connection, which is removed in the singulation process (for instance by sawing), while the term tie bar is applied to a metallic connection, which may be severed but prevails in the singulation process.

The preferred metal for clip 500 is copper in the thickness range from about 0.1 to 0.3 mm, more preferably about 0.125 or 0.25 mm. Copper is known to have high electrical and thermal conductivity, suitable for semiconductor devices and especially power transistors. Alternative metals include aluminum and iron-nickel alloys. At least one surface, and preferably both surfaces, of clip 500 have a metallurgical preparation to be solderable. A preferred technique includes the deposition of a layer of tin or a consecutive sequence of layers of nickel, palladium, and (for some devices) gold.

Figure 6:
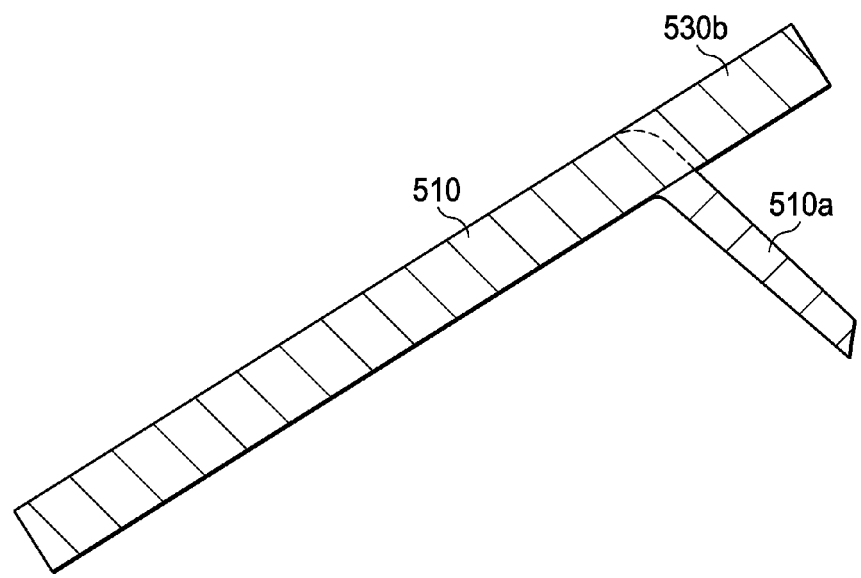
FIG. 6 shows a side view of the clip of FIG. 5.

As FIG. 5 shows, exemplary clip 500 includes an elongated flat area 510 and a ridge 510a. Flat area 510 is sized to contact a terminal of an MOS FET (field effect transistor). Ridge 510a does not continue in the plane of area 510, but continues at an angle relative to area 510. The angle is designed to establish contact to a terminal of a substrate, for instance to a lead of a leadframe, which is used as the substrate for a vertically stacked semiconductor power supply system. In the example of FIG. 5, the angle results from the smooth bending by an external force; in other clips, the angle results from offsets in abrupt steps created by etching. The side view of FIG. 6 depicts a strong bending of ridge 510a away from the planar area 510.

FIG. 5 illustrates that exemplary clip 500 has a plurality of tie bars 530, which extend from flat area 510. Exemplary clip 500 has four tie bars 530; other embodiments may have at least one tie bar at each end of elongated area 510. The tie bars are designed so that after a short portion 530a, the end portions 530b of all tie bars 530 are aligned in a common direction, herein referred to as x-direction. Preferably, the end portions are parallel to each other. In the illustrated preferred embodiment, the tie bars are in the same plane as flat area 510; FIG. 6 illustrates such continuation of tie bar portions 530b in the plane of flat area 510. In other embodiments, however, the tie bars may be offset from the plane of the flat area.

Figure 7:
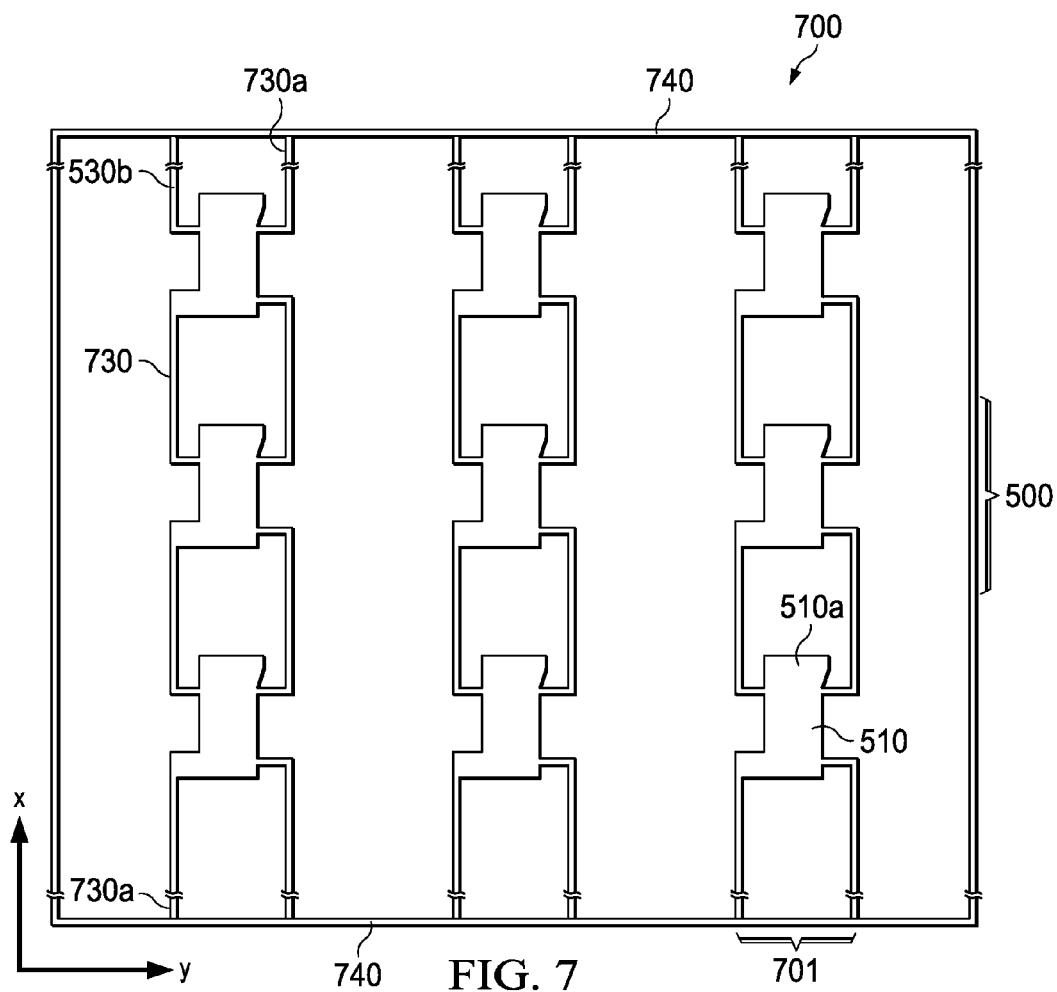
FIG. 7 depicts a top view of a strip of gang clips in x-direction rows with stabilizing frame in y-direction.

Referring now to FIG. 7, it shows that clips 500 are preferably employed in strip form, since it is preferred that the clips are stamped or etched from a single sheet of metal for acquiring their contours and shapes. In the example of FIG. 7, a matrix 700 is illustrated comprising of a plurality rows (or chains) 701 of gang clips. FIG. 7 depicts three chains 701; however, the matrix may include many more chains. The chains of clips are arrayed linearly in the x-direction and preferably parallel, each chain including a plurality of clips. In FIG. 7, chains 701 show three clips out of larger pluralities of chains. The clips in a chain are aligned so that respective end portions 530b of tie bars are merged in a single direction (x-direction) to form elongated tie bars 730 and thus elongated chains of clips. It should be noted that the chains are free of cross-linking tie bars, i.e. tie bars in the y-direction, which would connect one chain with an adjacent chains.

As stated, chains 701 of a plurality are preferably arrayed parallel to each other in the x-direction and are free of tie bars in the y-direction between adjacent chains. Furthermore, the chain ends 730a of a plurality are tied to rails 740 normal to the chains 701; rails 740 are in the y-direction. In this fashion, the matrix 700 of clips includes rails 740 as a stabilizing frame. The frame has been stamped and formed with the matrix of clips from a single sheet of metal such as copper, aluminum, or silver. Consequently, the frame acts as a master frame to ensure the necessary stability and precision of each clip during the assembly of semiconductor systems. After completing its stabilizing job during the assembly steps, rails 740 of the master frame are removed during the singulation step.

Figure 8:
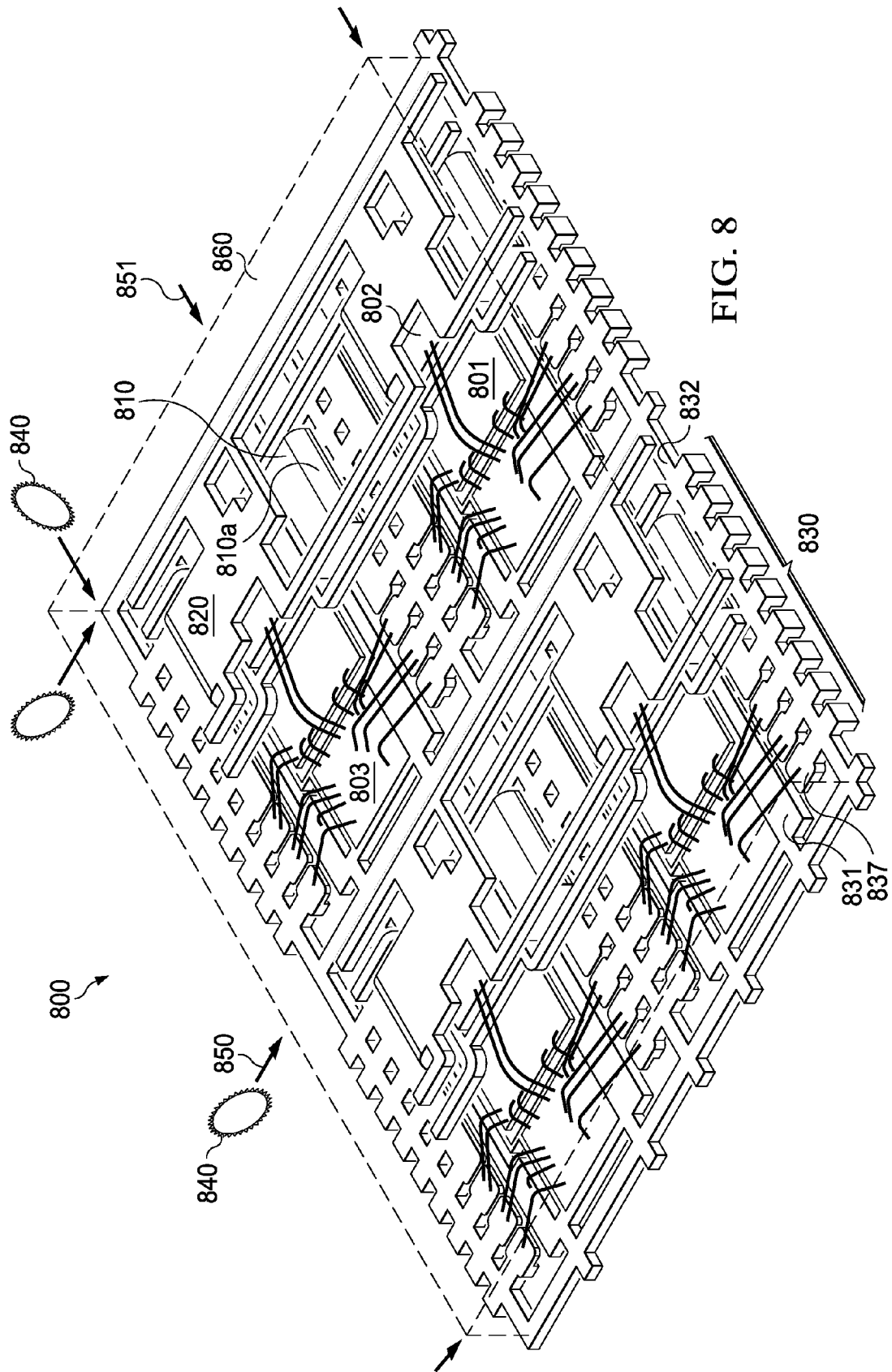
FIG. 8 illustrates a perspective view of a strip of exemplary vertically stacked power supply systems according to the invention, the systems constructed with gang clips having tie bars solely in x-direction.

The technical advantages of the simplified solution of the invention become evident from considering an embodiment, wherein an exemplary matrix of gang clips as shown in FIG. 7 is applied to fabricating a strip of electronic devices such as converters or regulators, especially semiconductor power supply systems such as DC/DC converters. The active electronic components employed to achieve these functions may be as diversified as MOS field effect transistors (MOSFETs), transistors based on GaN, GaAs and other III-V and II-IV materials, SiC, and bipolar transistors. A resulting strip 800 of exemplary systems of vertically stacked and packaged converters is illustrated in FIG. 8. The strip is finally singulated into discrete systems by sawing.

The exemplary strip 800 of converters, shown in an encapsulation 860 of for clarity purposes transparent material, is constructed on a strip of substrates, which includes a plurality of discrete units. The substrate strip may be a metallic leadframe strip or a laminate strip using tapes. Each substrate has a pad for assembling (preferably by soldering) semiconductor chips or stacks of chips; each substrate further has a plurality of terminals such as metallic leads and metal contact pads. In the exemplary embodiment of FIG. 8, the substrate is a leadframe. Visible through the transparent encapsulation of FIG. 8, leadframe 830 of each unit is suitable for Quad Flat No-Lead (QFN) and Small Outline No-Lead (SON) type modules. The leads 837 may be approximately uniformly distributed on one or more sides of the leadframe; in the exemplary device of FIG. 8, the leads 837 are on two sides of the pad 831, leaving the other pad sides free of leads.

The leadframe is preferably made of copper or a copper alloy; alternative metal selections include aluminum, iron-nickel alloys, and Kovar™. Both surfaces of the leadframe may be prepared to facilitate solder attachment, for instance by a plated layer of tin or by a sequence of plated layers of nickel, palladium, and gold. In addition, the at least one surface may have a metal layer deposited to enhance thermal conductivity, for instance by a plated layer of silver. Preferred thickness of the leadframe metal for the exemplary embodiment shown in FIG. 8 is 0.2 mm; other embodiments may use thinner or thicker (e.g., 0.3 mm) leadframe metal. From the standpoint of low cost and batch processing, it is preferred to start with sheet metal and to stamp or etch the leadframe as a strip of units interconnected by rectangular frames of tie rails 832. Adjacent units share the tie rails. The units are singulated by trimming the tie rails 832 (preferably by sawing) after the encapsulation process, which creates the package of the converters. Where the cuts sever metallic connections between leads 837 and rails 832, the cuts will be visible at the package sidewalls created by the singulation process.

In FIG. 8, each pad serves as the basis of a power supply system to be stacked vertically, including two semiconductor FET (MOS field effect transistor) chips and two connecting clips. In order to simplify the assembly processes of semiconductor power supply systems and keep fabrication cost low, the clips are applied as a batch process in wafer-level fabrication flow. The clips are provided as a plurality of parallel rows in the x-direction, wherein the plurality is stabilized by a master frame 740, as discussed in FIG. 7. The master frame with the grid of arrayed clips is manufactured (by stamping or etching) from a single sheet of metal. The clips of a row are fastened to adjacent clips by tie bars; however there are no cross-connections in the y-direction to a clip of a parallel chain. The clips have a precise, steady position so that the clips can be assembled with precision to semiconductor chips during the assembly flow of the system-under-construction.

In the assembly flow of the converters, a terminal of the first FET chips 801 is attached to respective pads 831 of the leadframe array. In addition, an integrated circuit driver-and-control chip 803 may be attached to each pad adjacent to the first FET chip 801. Then, a sheet with the first gang clips is aligned in order to attach the flat area 810 of the first clips vertically to the opposite terminals of the first FET chips 101, and the ridge 810a of the first clip to substrate pins. As mentioned in conjunction with FIG. 5, metallic clips are generally shaped to include a flat area for contacting an FET terminal and, at an angle to the flat area, a ridge for contacting a contact pad or substrate lead.

Figure 9:
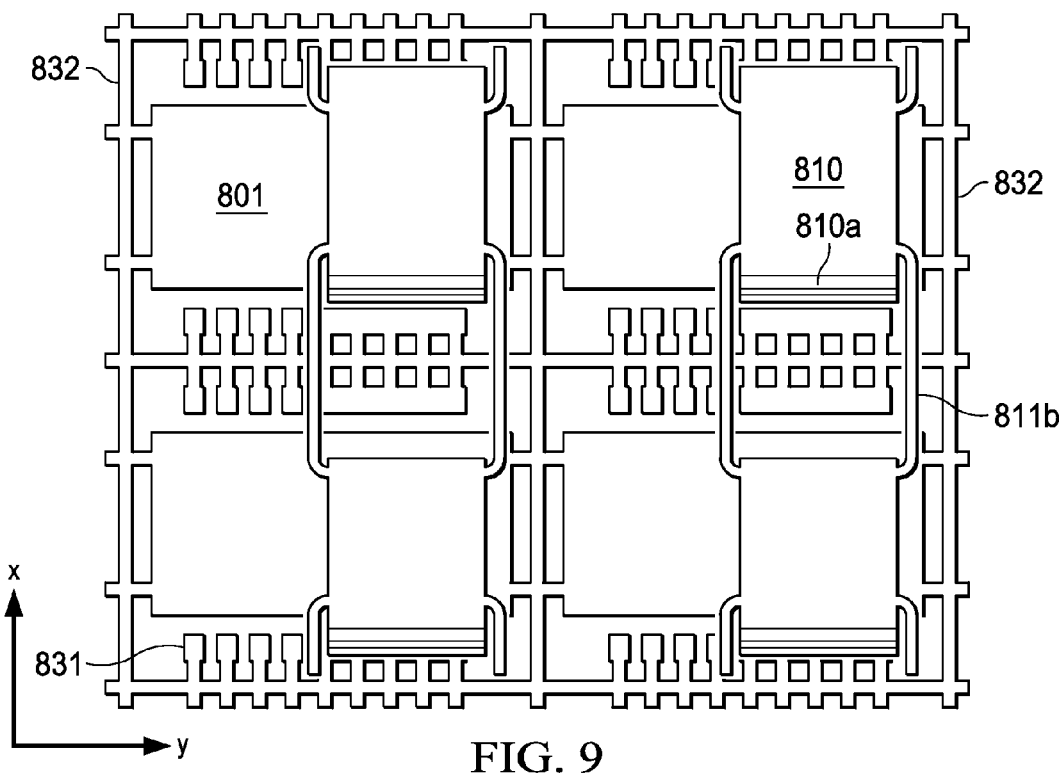
FIG. 9 shows a top view of a leadframe strip for power supply systems with parallel rows of first gang clips vertically aligned, the first clips having tie bars solely in x-direction according to the invention.

As illustration, FIG. 9 depicts the first clips over the leadframe sites (the first FET chips are not shown). It should be noted that the interconnected clip areas 810 of a chain of clips align with respective leadframe pads, and that the positions of tie bars 811 are not aligned with leadframe tie rails 832. The ridges 810a of the first clips are attached to respective leads of the leadframe. As gang clips, the first clips are aligned in the x-direction in rows, which run parallel to each other. Along a row, the clips are coupled to one another by tie bars 811 substantially oriented in the line of the row. Adjacent rows, however, are not connected by tie bars, thereby eliminating any tie rails for the first clips. Rather, the stability of a row is assured by coupling each row end to a master frame, which runs normal to the rows and will not be incorporated in encapsulation material (see FIG. 7); it can thus easily be trimmed in the singulation process.

Figure 10:
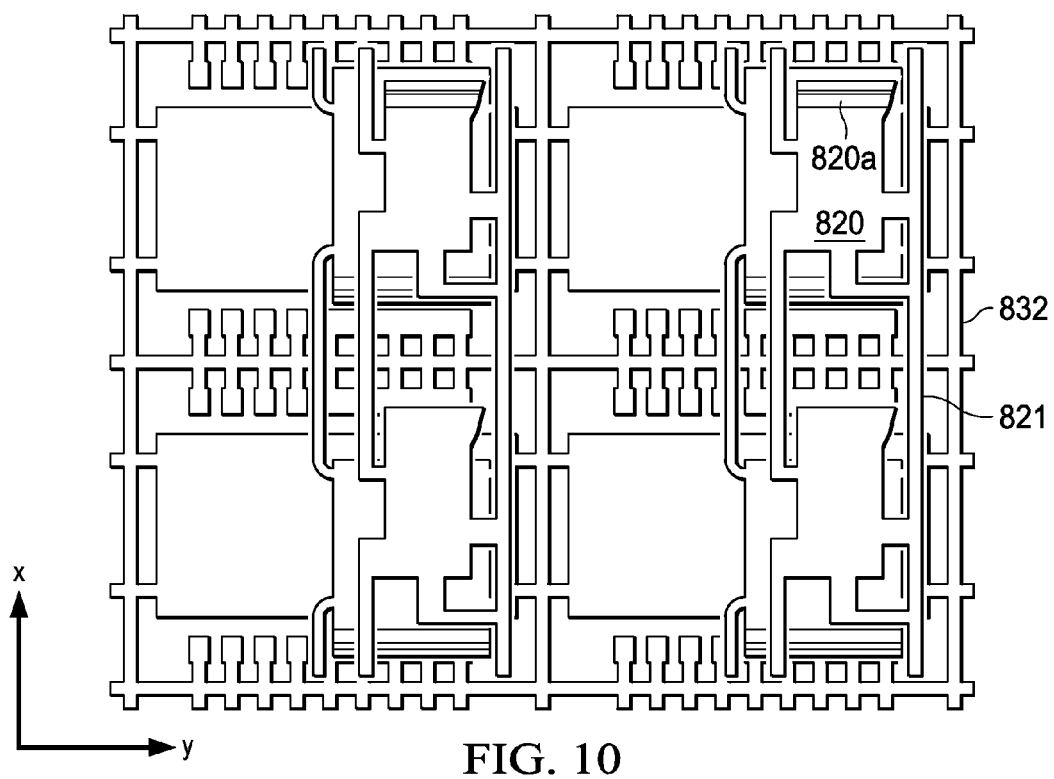
FIG. 10 shows a top view of a leadframe strip for power supply systems with parallel rows of first and second gang clips vertically aligned, the first and second clips having tie bars solely in x-direction according to the invention.

In the continuing assembly flow of the embodiment of FIG. 8, second FET chips 802 are then vertically attached with a terminal to the flat areas 810 of the first clips. Then, a sheet with the second gang clips is aligned in order to attach the flat area 820 of the second clips vertically to the opposite terminals of the second FET chips 802, and the ridge 820a of the second clip to substrate pins. In the exemplary embodiment of a power supply system in FIG. 8, the vertical stacking of two different FET chips 801 and 802 requires clips of two distinct shapes. As illustration, FIG. 10 depicts the second clips over the first clips and the leadframe sites (the first and second FET chips are not shown). It should be noted that the interconnected clip areas 820 of a chain of second clips align with respective first clip areas 810 (and leadframe pads), and that the positions of tie bars 821 are not aligned with leadframe tie rails 832. The ridges 820a of the second clips are attached to respective leads of the leadframe. As gang clips, the second clips are aligned in the x-direction in rows, which run parallel to each other. Along a row, the clips are coupled to one another by tie bars 821 substantially oriented in the line of the row (x-direction). Adjacent rows, however, are not connected by tie bars in the y-direction, thereby eliminating any tie rails for the second clips. Rather, the stability of a row is assured by coupling each row end to a master frame, which runs normal to the rows and will not be incorporated in encapsulation material (see FIG. 7); it can thus easily be trimmed in the singulation process.

Figure 11:
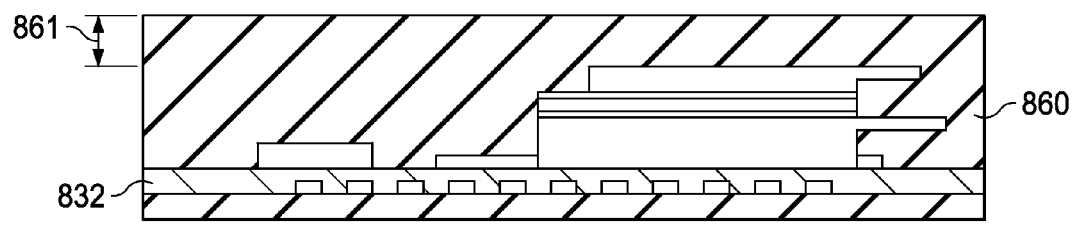
FIG. 11 shows a side view of a stacked power supply system with tie rails only for the leadframe used in the system.

FIG. 11 illustrates an imaginary x-ray view of the assembled stack of chips and clips; the view may be taken in the x-direction or in the y-direction. In either case, there is only the tie rail of the substrate (leadframe), which will have to be cut during the singulation process, since the clips have no tie rails.

In the next process step, the array of vertical stacks of FET chips and clips is encapsulated in a packaging material 860 such as a molding compound. Due to the market pressure demanding miniaturized products with regard to size and thickness, the thickness 861 of encapsulation material above the top of the second clip may be kept as thin as technology allows.

For singulating the strip of FIG. 8 with the assembled array of converters into discrete packaged systems, rotating saws 840 are applied to cut through the plastic package compound and through the tie rail 832 of the substrate (leadframe), along the directions of the substrate tie rails. The directions of these cuts are indicated by arrows 850 and 851 in the example of FIG. 8.

Figure 1:
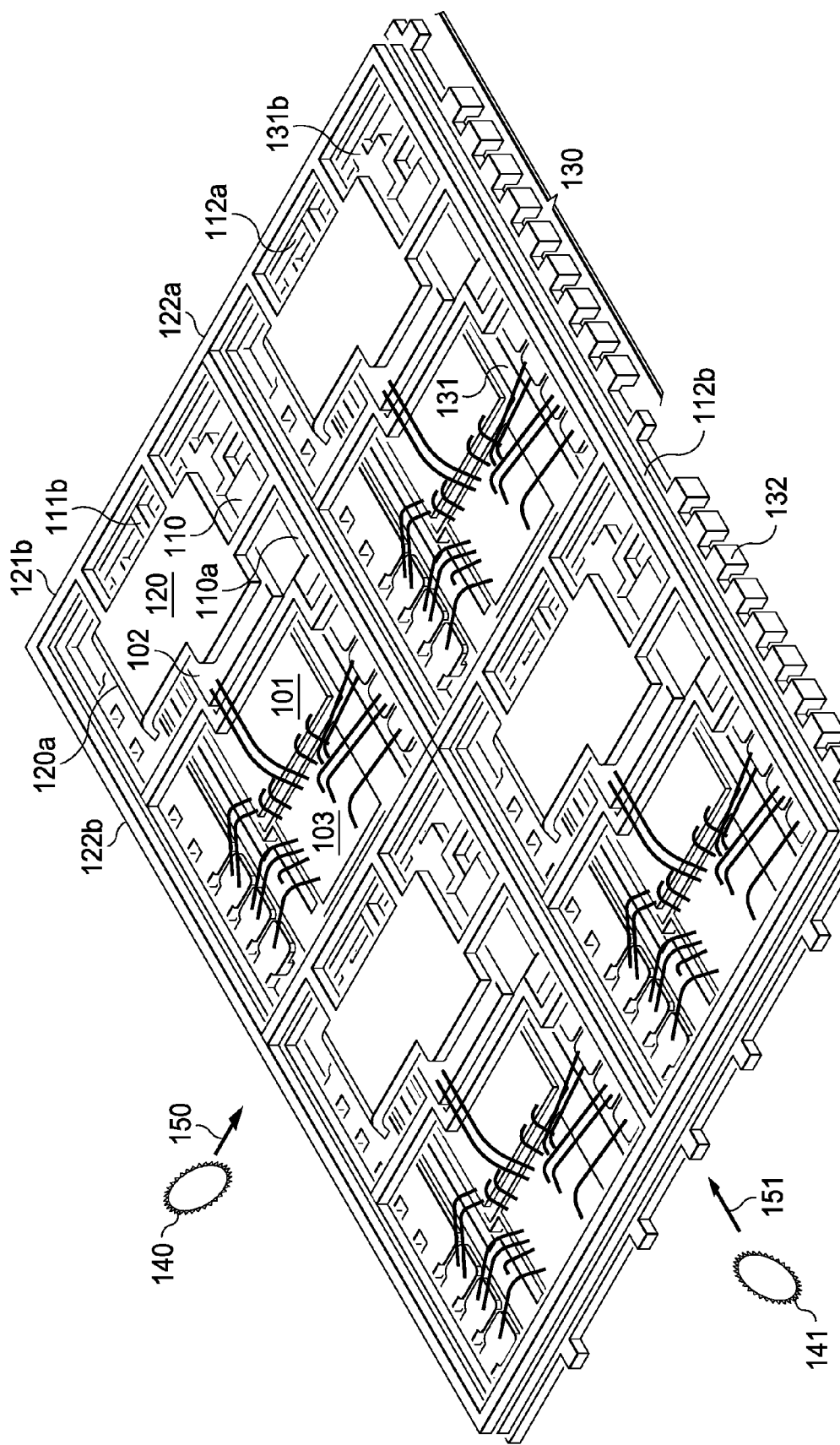
FIG. 1 (Prior Art) shows a strip of conventional power supply systems with two levels of vertically stacked gang clips; within each level, the clips are stabilized by tie bars to tie rails in x- and y-directions; the levels of tie rails are vertically aligned by aligning the tie rails.
Figure 2:
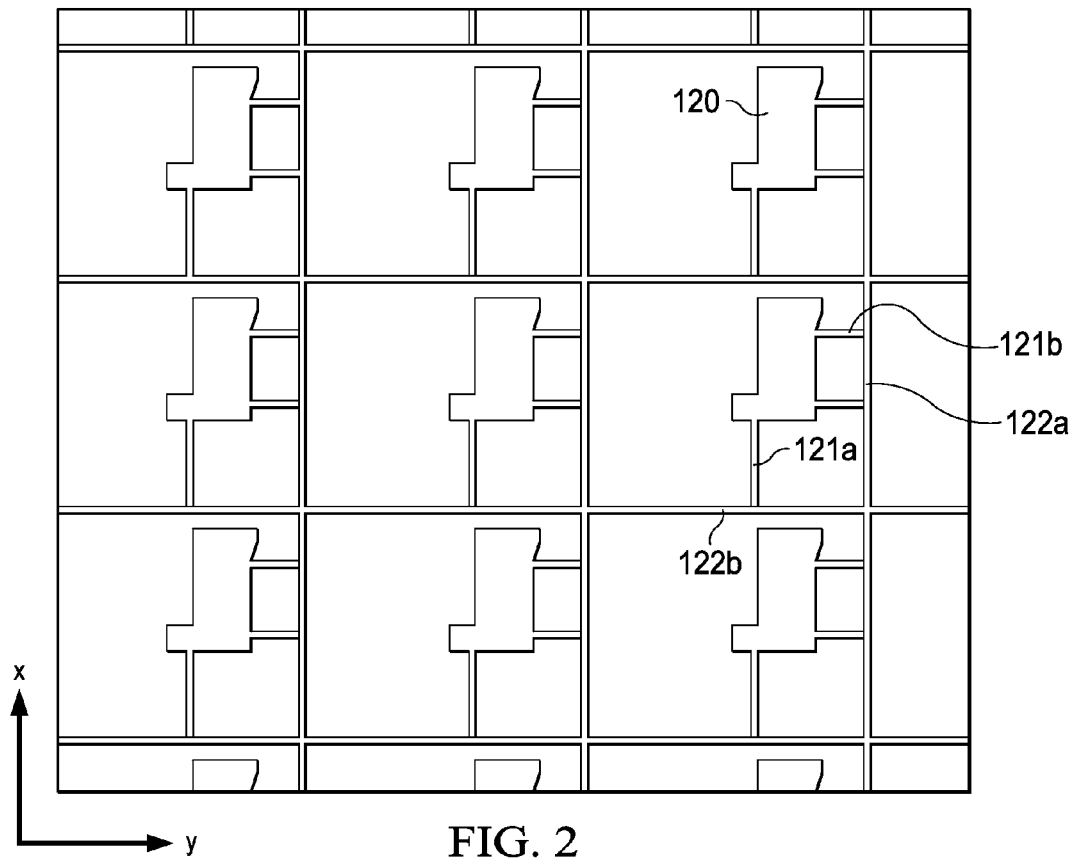
Figure 3:
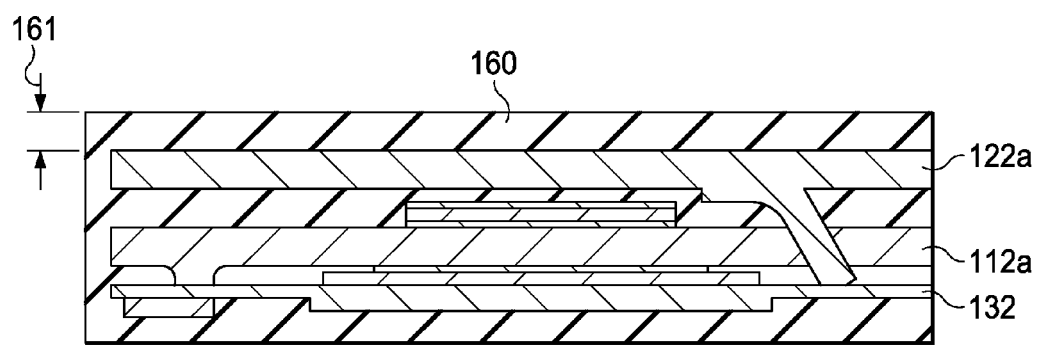
FIG. 3 (Prior Art) shows a side view of the conventional stacked and aligned tie rails of the clips used in the power supply system.
Figure 4:
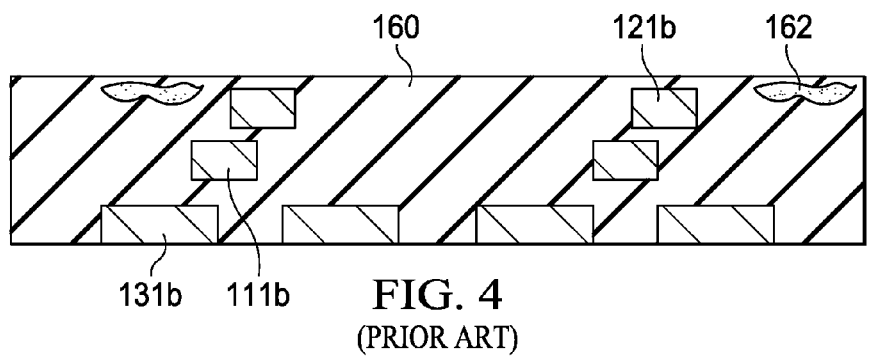
FIG. 4 (Prior Art) displays a view of a conventional package sidewall after the cutting process of singulation.
Figure 12:
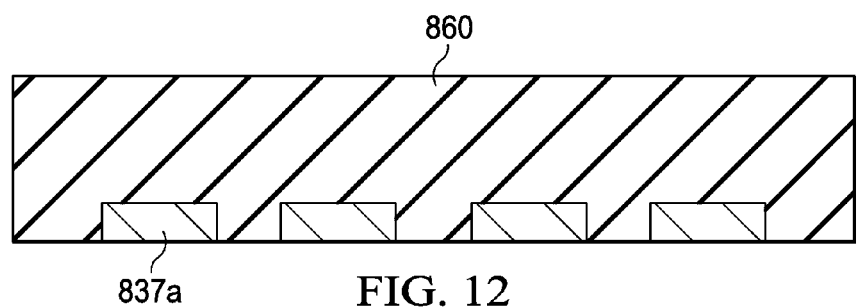
FIG. 12 displays a view of a package sidewall after the sawing process of singulation, showing cut tie bars only for the leadframe used in the system

A view of a sidewall of the packaged system, which is created by the sawing process, is displayed in FIG. 12. The view reveals a cross section through the packaging material 860 and the cut tie bars 837a of the leads 837, which the saw had to sever as the single tie bars during the removal of the leadframe tie rail 832 in the singulation operation. Therefore a comparison of FIG. 12 displaying a converter according to the invention with FIG. 4 displaying a converter according to prior art shows the absence of metal parts close to the top surface of packaging material 860. Consequently, the singulation operation does not have to overcome misaligned tie bars and does not cause any stress between cut metal and thin plastic material, both of which are causes of plastic chip-outs and unwanted exposed metal in conventional production.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors, to bipolar transistors, insulated gate transistors, thyristors, and others.

As another example, the high current capability of the stacked converter can be further extended, and the efficiency further enhanced, by leaving the top surface of the second clip un-encapsulated so that the second clip can be connected to a heat sink, preferably by soldering. In this configuration, the hexahedron-shaped module can dissipate its heat from both large surfaces to heat sinks.

It is therefore intended that the appended claims encompass any such modifications or embodiments.

We claim:

1. A gang clip comprising:
a metallic clip including a flat area and a ridge bending away from the flat area at an angle; and
a plurality of tie bars extending from the flat area, the end portions of the tie bars aligned in a common orientation, wherein at least one surface of the gang clip has a metallurgical configuration suitable for solder attachment.

2. A gang clip comprising:
a metallic clip including a flat area and a ridge bending away from the flat area at an angle; and
a plurality of tie bars extending from the flat area, the end portions of the tie bars aligned in a common orientation, wherein the metal is selected from a group including copper, aluminum, and silver and has high electrical and thermal conductivity suitable for semiconductor devices.

3. A matrix of gang clips comprising:
a plurality of gang clips having a flat area, a ridge, and tie bars extending from the flat area, the end portions of the ties bars aligned in a common direction;
the plurality of gang clips having respective end portions of tie bars merged unidirectionally to form an elongated chain of clips; and
a plurality of chains arrayed parallel to each other, free of tie bars between adjacent chains, the plurality having the chain ends tied at both ends to rails normal to the plurality of chains to form a matrix of gang clips having the rails as a stable frame.

4. The matrix of claim 3 wherein the matrix including the stable frame are stamped and formed of a single sheet of metal.

5. The matrix of claim 4 wherein the single sheet is selected from a group of metals including copper, aluminum, and silver.

6. A packaged power supply system comprising:
a metallic QFN leadframe having a plurality of leads and a pad;
a first FET chip vertically attached onto the pad;
a first gang clip having a flat area vertically attached onto the first FET chip and the ridge tied to a first lead from the plurality of leads;
a second FET chip vertically attached onto the first gang clip;
a second gang clip having thea flat area vertically attached onto the second FET chip and the ridge tied to a second lead from the plurality of leads, completing the vertically attached power supply system; and
a package compound encapsulating the power supply system, the package having sidewalls free of exposed metal except sawed cuts of leads.

7. The packaged system of claim 6 wherein the package is shaped as a hexahedron.

8. The packaged system of claim 6 wherein the cut leads are created by the singulation process of trimming the leadframe after the encapsulating.

\* \* \* \* \*